US008112691B1

(12) United States Patent
Spracklen (10) Patent No.: US 8,112,691 B1
(45) Date of Patent: Feb. 7, 2012

(54) METHOD FOR EFFICIENT GENERATION OF A FLETCHER CHECKSUM USING A SINGLE SIMD PIPELINE

(75) Inventor: Lawrence A. Spracklen, Boulder Creek, CA (US)

(73) Assignee: Oracle America, Inc., Redwood Shores, CA (US)

( * ) Notice: Subject to any disclaimer, the term of this patent is extended or adjusted under 35 U.S.C. 154(b) by 988 days.

(21) Appl. No.: 12/079,367

(22) Filed: Mar. 25, 2008

(51) Int. Cl.
*G06F 11/00* (2006.01)
(52) U.S. Cl. .......................... 714/758; 714/807; 712/22
(58) Field of Classification Search .................. None
See application file for complete search history.

(56) References Cited

U.S. PATENT DOCUMENTS

| 5,247,524 | A | | 9/1993 | Callon | 371/53 |
| 5,526,501 | A | * | 6/1996 | Shams | 711/217 |
| 5,960,012 | A | | 9/1999 | Spracklen | 371/53 |
| 2008/0181513 | A1 | * | 7/2008 | Almeida | 382/224 |
| 2009/0274202 | A1 | * | 11/2009 | Hanke et al. | 375/220 |
| 2010/0077225 | A1 | * | 3/2010 | Salgado et al. | 713/189 |

OTHER PUBLICATIONS

P. Deutsch and J-L. Gailly, ZLIB Compressed Data Format Specification version 3.3, RFC 1950, Network Working Group, May 1996 (10 pages).
J. Zweig and C. Partridge, TCP Alternate Checksum Options, RFC 1146, Network Working Group, Mar. 1990 (5 pages).

* cited by examiner

*Primary Examiner* — Christopher McCarthy
(74) *Attorney, Agent, or Firm* — Fliesler Meyer LLP (57) ABSTRACT

The generation of Fletcher/Alder partial checksums are transformed from a space that requires integer multiplications and additions to a space that requires only integer additions and shifts on a single SIMD pipeline capable processor. This transformation permits the use of Fletcher/Alder checksums on processors where the performance of SIMD instructions are sub-optimal, on CMT processors that support a single SIMD pipeline as well as other processors that can be configured by executing software to implement SIMD operations for a single SIMD pipeline. The implementation of the process with this transformation on a general-purpose computer system transforms that general-purpose computer system into a special-purpose computer system that uses a single SIMD pipeline to generate a Fletcher/Alder checksum. The elimination of integer multiplications in the generation of the partial checksums results in a significant improvement in performance.

11 Claims, 10 Drawing Sheets

METHOD FOR EFFICIENT GENERATION OF A FLETCHER CHECKSUM USING A SINGLE SIMD PIPELINE

BACKGROUND OF THE INVENTION

1. Field of the Invention

The present invention relates generally to techniques for data integrity checking, and more particularly to checksums used for data integrity checking.

2. Description of Related Art

While numerous variants of checksums are commonly used to provide data integrity checks in a wide variety of applications, such as networking, zettabyte file systems, logging, etc., the determination of checksums in an efficient manner is still problematic, because the determination of checksums can become a performance bottleneck. Over time, the determination of checksums has evolved to try and eliminate or at least minimize the performance issues.

Early on in the determination of checksums it was recognized that generally computers exhibit a better performance with integer computations. J. G. Fletcher developed the Fletcher Checksum as an alternative to cyclic redundancy codes (J. Fletcher, "An Arithmetic Checksum for Serial Transmissions", IEEE Transactions on Communications, vol. COM-30, p. 247, January 1982). The Fletcher checksum is an integer arithmetic checksum that exhibits a reasonable level of error detection, and lends itself to software implementation on non-dedicated processors.

Reducing the overhead of error detection increases transmission efficiency and allows higher data transmission rates. Experimentation suggested that throughput could be significantly affected by the implementation of the error detection algorithm utilized. On one occasion, it was reported that the throughput tripled when the implementation of Fletcher's checksum utilized was changed from an unoptimized version to an optimized version, (A. Nakassis, "Fletcher's Error Detection Algorithm: How to implement it efficiently and avoid the most common pitfalls", ACM Comp. Commun. Rev., Vol. 18, p. 63, October 1988).

The Fletcher/Alder checksum is determined by calculating two partial checksums S1 and S2 and concatenating the two into an integer. Partial checksum S1 is the sum of the bytes in the string of data while partial checksum S2 is the sum of the individual values of partial checksum S1 for each step i, i.e., $$S1i+=bi$$

$$S2i+=S1i$$

where bi represents the ith byte of data were i ranges from 0 to (N−1) for a data string of N bytes.

Various methods have been used to implement the Fletcher/Alder checksum. However, given that second partial checksum S2$i$ is derived from first partial checksum S1$i$, implementing the Fletcher/Alder checksum for a single Single Instruction Multiple Data (SIMD) pipeline has been problematic and a source of a performance bottleneck.

However, for processors that support multiple SIMD pipelines architectures, a novel approach was presented in U.S. Pat. No. 5,960,012, entitled "Checksum Determination Using Parallel Computations on Multiple Packed Data Elements" of Lawrence A. Spracklen, Sep. 28, 1999. In this method, the coupling between the two partial checksums of Fletcher/Alder was broken so that each partial checksum could be determined using a SIMD pipeline.

The Fletcher/Alder checksums were represented as:

$$S1n=\Sigma bi$$

$$S2n=\Sigma(n-1)bi$$

This implementation works well for multiple SIMD pipelines. However, many of the concurrent multiple threading processors support only a single SIMD pipeline, and the performance of SIMD instructions is sub optimal. Further, standard integer implementations of the Fletcher/Alder checksums are not providing sufficient performance and are perceived as a performance bottleneck. Thus, the continued use of the Fletcher/Alder checksum in applications, where performance is an issue, is problematic.

SUMMARY OF THE INVENTION

In one embodiment of this invention, the prior art issues with using the Fletcher/Alder checksums with a single SIMD pipeline have been overcome. A computer-based method uses a single SIMD pipeline in a processor to perform a process for generating a Fletcher/Alder checksum for a data string. The process transforms the generating of the partial checksums from a space requiring integer multiplications and additions to a space requiring only integer additions and shifts. This transformation provides a significant improvement in processor performance and thereby extends the range of applications that can use the Fletcher/Alder checksums for data integrity checking.

The process accumulates a plurality of first sub-partial checksums S1[0], S1[1], . . . , S1[N−1]. N is an integer, which is the degree of SIMD processing.

The plurality of first sub-partial checksums S1[0], S1[1], . . . , S1[N−1] is stored in integer registers of the processor.

The process also accumulates a plurality of second sub-partial checksums S2[0], S2[1], . . . , S2[N−1]. The plurality of second sub-partial checksums S2[0], S2[1], . . . , S2[N−1] is stored in integer registers of the processor.

The plurality of second sub-partial checksums S2[0], S2[1], . . . , S2[N−1] is accumulated to generate a SIMD second partial checksum. The SIMD second partial checksum is scaled, using a shift operation, by N to obtain a scaled SIMD second partial checksum. The scaled SIMD second partial checksum is corrected to generate a second partial checksum S2.

The plurality of first sub-partial checksums S1[0], S1[1], . . . , S1[N−1] is accumulated to generate a first partial checksum S1.

The first and second partial checksums S1, S2 are combined to generate a Fletcher/Alder checksum for the data string. The Fletcher/Alder checksum is stored in a memory, or alternatively is compared with a stored Fletcher/Alder checksum to determine the integrity of the data string. In either case, the Fletcher/Alder checksum is used in determining the integrity of the data string.

BRIEF DESCRIPTION OF THE DRAWINGS

In the drawings and following Detailed Description, elements with the same reference numeral are the same or equivalent elements. The first digit of a reference numeral is the figure number of the figure in which the element with that reference numeral first appeared.

DETAILED DESCRIPTION

In one embodiment of this invention, the generation of Fletcher/Alder partial checksums are transformed from a space that requires integer multiplications and additions to a space that requires only integer additions and shifts on a single SIMD pipeline capable processor. This transformation permits the use of Fletcher/Alder checksums on processors where the performance of SIMD instructions are sub-optimal, on concurrent multithreading (CMT) processors that support a single SIMD pipeline as well as other processors that can be configured by executing software to implement SIMD operations for a single SIMD pipeline. Thus, the Fletcher/Alder checksum can be used in configurations where the checksum was previously unacceptable due to performance bottlenecks.

In general, the implementation of the process with this transformation on a general-purpose computer system transforms that general-purpose computer system into a special-purpose computer system that uses a single SIMD pipeline to generate a Fletcher/Alder checksum. As described more completely below, the elimination of integer multiplications in the generation of the partial checksums results in a significant improvement in performance.

Figure 1:
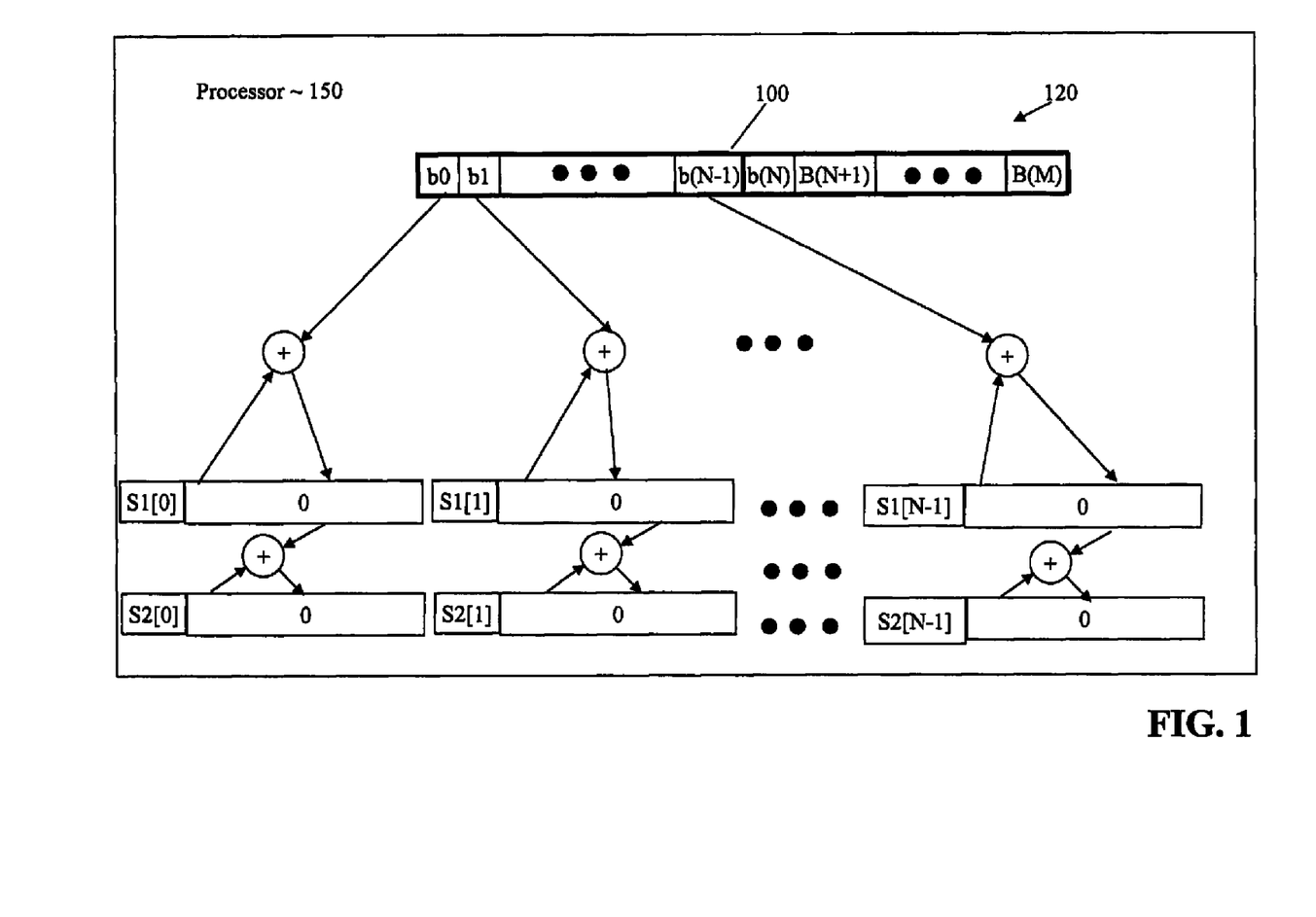
FIG. 1 is an illustration of the components used in a processor to implement one embodiment of this invention.
Figure 2:
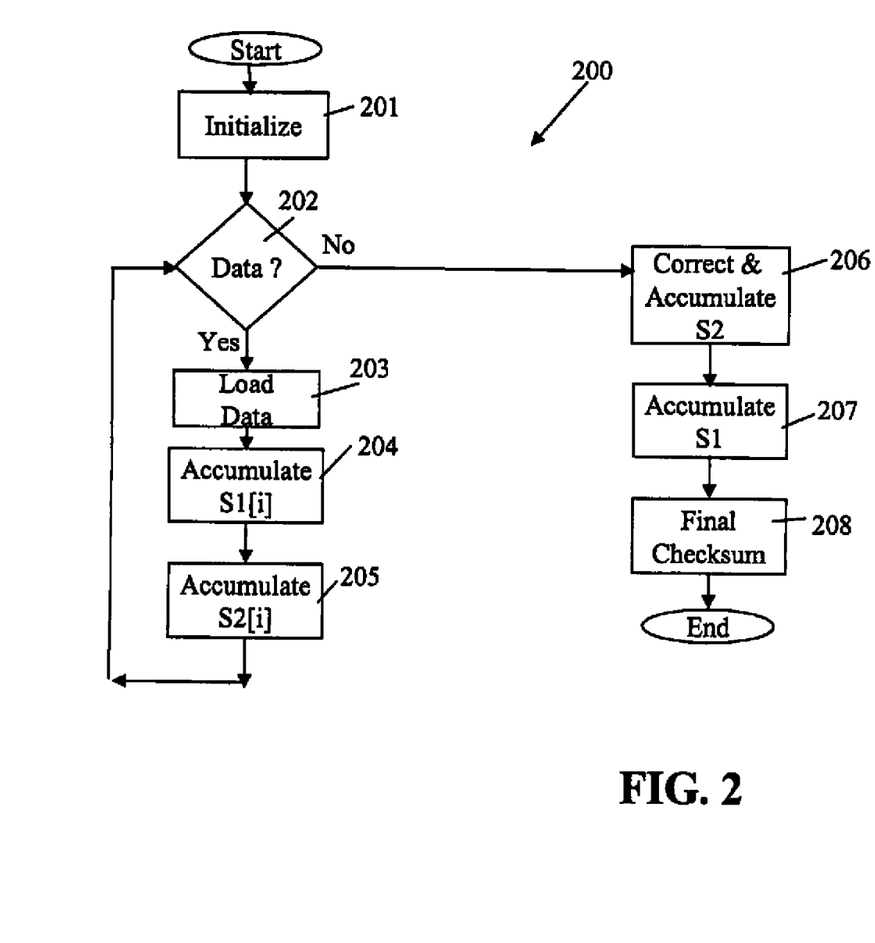
FIG. 2 is a process flow diagram for a process according to one embodiment of this invention.

In one embodiment, a single SIMD pipeline computer-based transformation process 200 [FIG. 2] on a processor 150 [FIG. 1] generates a Fletcher/Alder checksum by processing N units of data b1, b2, b(N−1) at a time from a data string 120. Here, N is the degree of SIMD processing and is an integer.

A different first sub-partial checksum accumulator S1[i] is associated with each unit of data bi in the plurality of data units, wherein i ranges from zero to (N−1). Thus, a plurality of first sub-partial checksum accumulators S1[0], S1[1], . . . , S1[N−1] (FIG. 1) for a first partial checksum S1 of the Fletcher/Alder checksum is used.

Similarly, a different second sub-partial checksum accumulator S2[i] in a plurality of second sub-partial second checksum accumulators S2[0], S2[1], . . . , S2[N−1] (FIG. 1) is associated with a different one of the plurality of first sub-partial checksum accumulators S1[0], S1[1], . . . , S1[N−1] and consequently with each unit of data bi in the plurality of data units. Thus, a plurality of second sub-partial checksum accumulators S2[0], S2[1], . . . , S2[N−1] for a partial second checksum S2 of the Fletcher/Alder checksum is used.

In initialize operation 201 of method 200, all of sub-partial checksum accumulators S1[0], S1[1], . . . , S1[N−1], S2[0], S2[1], . . . , S2[N−1] are initialized to zero. Initialize operation 201 transfers to data check operation 202.

Data check operation 202 determines whether all sets of N-data units in the M data units in data string 120 have been processed, where M is an integer. Since this is the initial operation, data is available and data check operation 202 transfers processing to load data operation 203. If all sets on N-data units in the data string 120 have been processed, in this embodiment, processing transfers from check operation 202 to correct and accumulate second partial checksum operation 206.

As shown in FIG. 1, load data operation 203 loaded a plurality of data units b1, b2, b(N−1) from data string 120 into a SIMD input register 100 of processor 150. As an example, assume N is 2 and M is eight. For this example, data units b0 and b1 are first loaded into SIMD input register 100. Load data operation 203 transfers processing to accumulate first sub-partial checksums operation 204.

In accumulate first sub-partial checksums operation 204, each data unit bi, in input register 100, is added to a value stored in the corresponding first sub-partial checksum accumulator S1[i] and the accumulated value is stored back in first sub-partial checksum accumulator S1[i]. Thus, for example, data unit b0 is added to the zero value in accumulator S1[0] and accumulated value b0 is stored in accumulator S1[0]. Data unit b1 is added to the zero value in accumulator S1[1] and accumulated value b1 is stored in accumulator S1[1]. The accumulations are done in parallel using a SIMD add operation.

S1[0]=b0 S1[1]=b1

Upon completion, accumulate first sub-partial checksums operation 204 transfers to accumulate second sub-partial checksums operation 205.

In accumulate second sub-partial checksums operation 205, each accumulated value stored in a first sub-partial checksum accumulator S1[i] is added to the accumulated value stored in the corresponding second sub-partial checksum accumulator S2[i] and the accumulated value is stored back in second sub-partial checksum accumulator S2[i]. Thus, for the example, accumulated value b0 in first sub-partial checksum accumulator S1[0] is added to the zero value in second sub-partial checksum accumulator S2[0] and the accumulated value b0 is stored in accumulator S2[0]. Similarly, accumulated value b1 is added to the zero value in second sub-partial checksum accumulator S2[1] and the accumulated value b1 is stored in accumulator S2[1]. Again, the accumulations are done in parallel. Thus, after a first iteration:

S1[0]=b0, S1[1]=b1,

S2[0]=b0, S2[1]=b1.

Upon completion, accumulate second sub-partial checksums operation 205 transfers to data check operation 202.

Continuing with the example, since data remains, load data operation 203 loads data units b2 and b3 in register 100. The result of accumulate first sub-partial checksums operation 204 is:

S1[0]=b0+b2, S1[1]=b1+b3,

S2[0]=b0, S2[1]=b1.

The result of accumulate second sub-partial checksums operation 205 is:

S1[0]=b0+b2 S1[1]=b1+b3

S2[0]=2b0+b2 S2[1]=2b1+b3

Upon completion, accumulate second sub-partial checksums operation 205 again transfers to data check operation 202.

Continuing with the example, since data still is available, load data operation 203 loads data units b4 and b5 in register 100. The result of accumulate first sub-partial checksum operation 204 is:

S1[0]=b0+b2+b4, S1[1]=b1+b3+b5,

S2[0]=2b0+b2, S2[1]=2b1+b3.

The result of accumulate second sub-partial checksum operation 205 is:

S1[0]=b0+b2+b4, S1[1]=b1+b3+b5,

S2[0]=3b0+2b2+b4, S2[1]=3b1+2b3+b5.

Upon completion, accumulate second sub-partial checksums operation 205 again transfers to data check operation 202.

Continuing with the example, load data operation 203 loads data units b6 and b7 in register 100 and the results of accumulate operations 204 and 205 are:

S1[0]=b0+b2+b4+b6, S1[1]=b1+b3+b5+b7,
S2[0]=4b0+3b2+2b4+b6, S2[1]=4b1+3b3+2b5+b7.

Upon completion, accumulate second sub-partial checksums operation 205 again transfers to data check operation 202.

At this point, all the sets of N-data units in the data string 120 have been processed and processing transfers from data check operation 202 to correct and accumulate second partial checksum operation 206. Notice that, unlike the prior art, up to this point the generation of the sub-partial checksums is implemented without utilizing integer multiply operations. The SIMD second partial checksum S2_SIMD is:

$$S2\_SIMD = S2[1] + S2[2]$$
$$= 4b0 + 4b1 + 3b2 + 3b3 + 2b4 +$$
$$2b5 + b6 + b7$$

while the correct second partial checksum S2 is:
S2=8b0+7b1+6b2+5b3+4b4+3b5+2b6+b7

Thus, the parallel accumulation of sub-partial checksums for second partial checksum S2 does not generate the correct value. If SIMD second partial checksum S2_SIMD is scaled by N, the degree of SIMD processing, the coefficient for data unit b0 is correct, but the coefficients for the other data units are overcorrected by this scaling. Thus, correct and accumulate second partial checksum operation 206 corrects SIMD second partial checksum S2_SIMD to obtain checksum S2 by first scaling checksum S2_SIMD and then correcting for the overcorrection.

In this embodiment, SIMD second partial checksum S2_SIMD is multiplied by the degree of SIMD processing N and that value is then corrected using the accumulated first sub-partial checksums. Specifically, $$S2 = \left(N * \sum_i S2[i]\right) - \left(\sum_i (i * S1[i])\right)$$

The first term on the right hand side of this expression is the scaling of SIMD second partial checksum S2_SIMD and the second term on the right hand side corrects for the overcorrection introduced by the scaling. Since the degree of SIMD processing N is a power of two, the multiplication by N is accomplished using a shift operation.

Further, even if a multiplication is performed, the multiplication operation is only in the generation of final second partial checksum S2 and not in generation of the second sub-partial checksums as in the prior art. Thus, the transformation of process 200 shows a processing improvement in single pipeline SIMD applications because costly integer multiplication operations have been minimized, and even eliminated in some cases, in the generation of second partial checksum S2.

For the above example, N is two and i ranges from zero to one. Thus, operation 206 generates:
S2=2*(S2[0]+S2[1])−0*S1[0]−1*S1[1]
S2=2*(4b0+4b1+3b2+3b3+2b4+2b5+b6+b7)−0*(b0+b2+b4+b6)−1*(b1+b3+b5+b7)
S2=8b0+7b1+6b2+5b3+4b4+3b5+2b6+b7

Upon completion of correct and accumulate second partial checksum operation 206, processing transfers to accumulate first partial checksum operation 207.

Accumulate first partial checksum operation 207 sums the accumulated first sub-partial checksums to obtain the first partial checksum S1. Operation 207 transfers to final checksum operation 208.

Final checksum operation 208 concatenates the two partial checksums S1 and S2 to obtain the final Fletcher/Alder checksum and stores the final checksum in a computer readable medium. Alternatively, the final Fletcher/Alder checksum is compared with a stored Fletcher/Alder checksum to determine the integrity of data string 120.

In some processors, use of SIMD multiply instructions leads to sub-optimal performance, and standard prior art integer implementations of the Fletcher/Adler checksum on such processors have been found lacking. Nevertheless, with the process described above, the Fletcher/Adler checksum can be efficiently generated in such processors.

In another embodiment, standard SIMD operations are emulated by virtually partitioning integer registers into a number of sub-fields. In this embodiment, virtual integer registers are established by execution of software on the processor. For example, in FIG. 3A, the data string is 16-bytes and is stored in an integer register 310. The degree of SIMD processing N is 4.

Figure 3A:
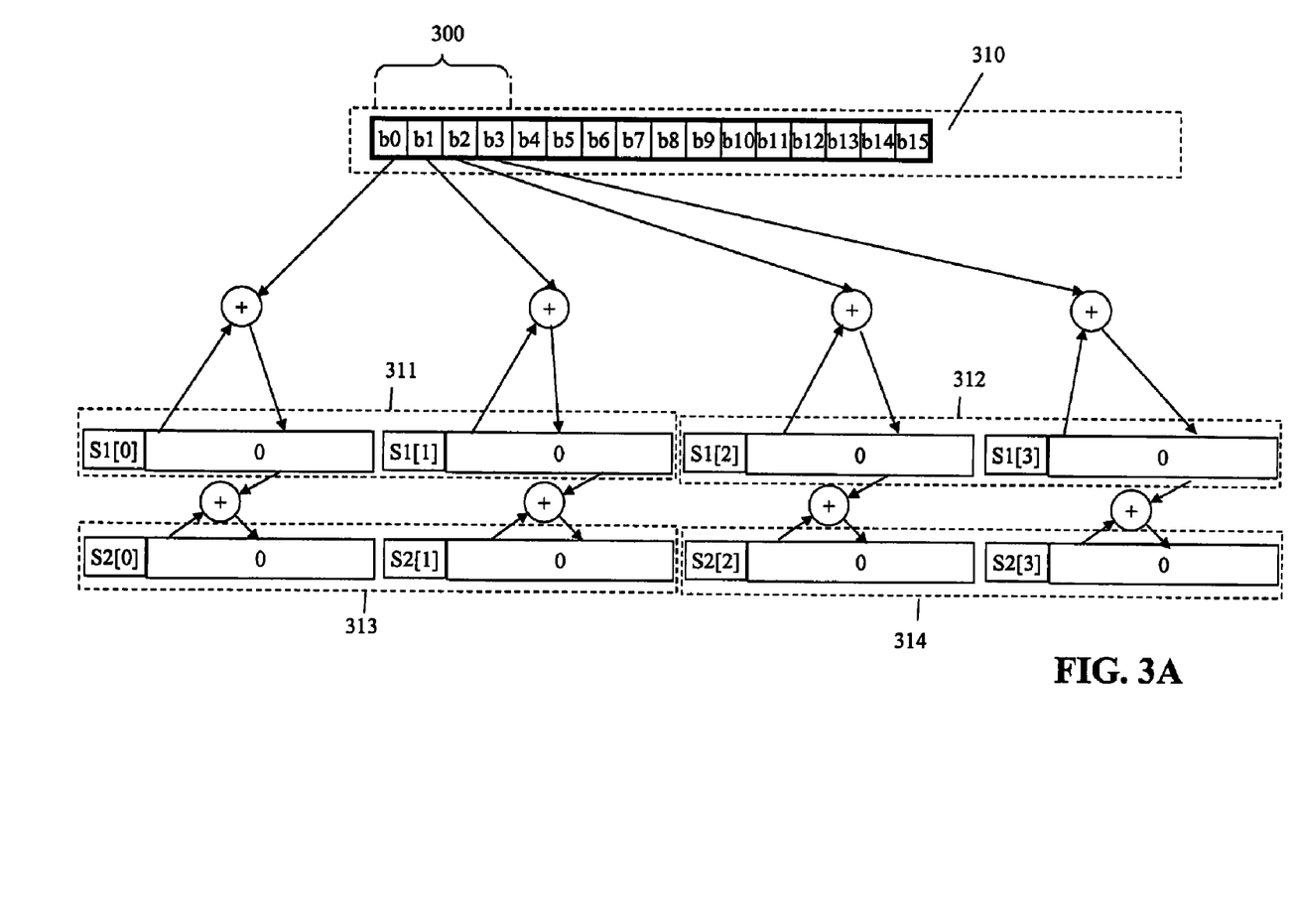
FIGS. 3A to 3F illustrate that state of the components of FIG. 1 when the process of FIG. 2 is used for a specific example.

A virtual input register 300 is defined that is four data units in size and so four data units are processed in parallel. Similarly, for example, a first integer register 311 is virtually partitioned to hold first sub-partial checksum accumulators S1[0], S1[1]; a second integer register 312 is virtually partitioned to hold first sub-partial checksum accumulators S1[2], S1[3]; a third integer register 313 is virtually partitioned to hold second sub-partial checksum accumulators S2[0], S2[1]; and a fourth integer register 314 is virtually partitioned to hold second sub-partial checksum accumulators S2[2], S2[3]. In this embodiment, the size of the virtual partitions are selected such that overflow from one virtual partition into another virtual partition is not a factor. In another embodiment, explained more completely below, the possibility of overflow is considered.

In process 200, the various accumulators and the input register are defined and then initialized. The initialization is equivalent to that described above. FIG. 3A illustrates the values in the various components upon completion of initialize operation 201, data check operation 202, and load data operation 203.

Figure 3B:
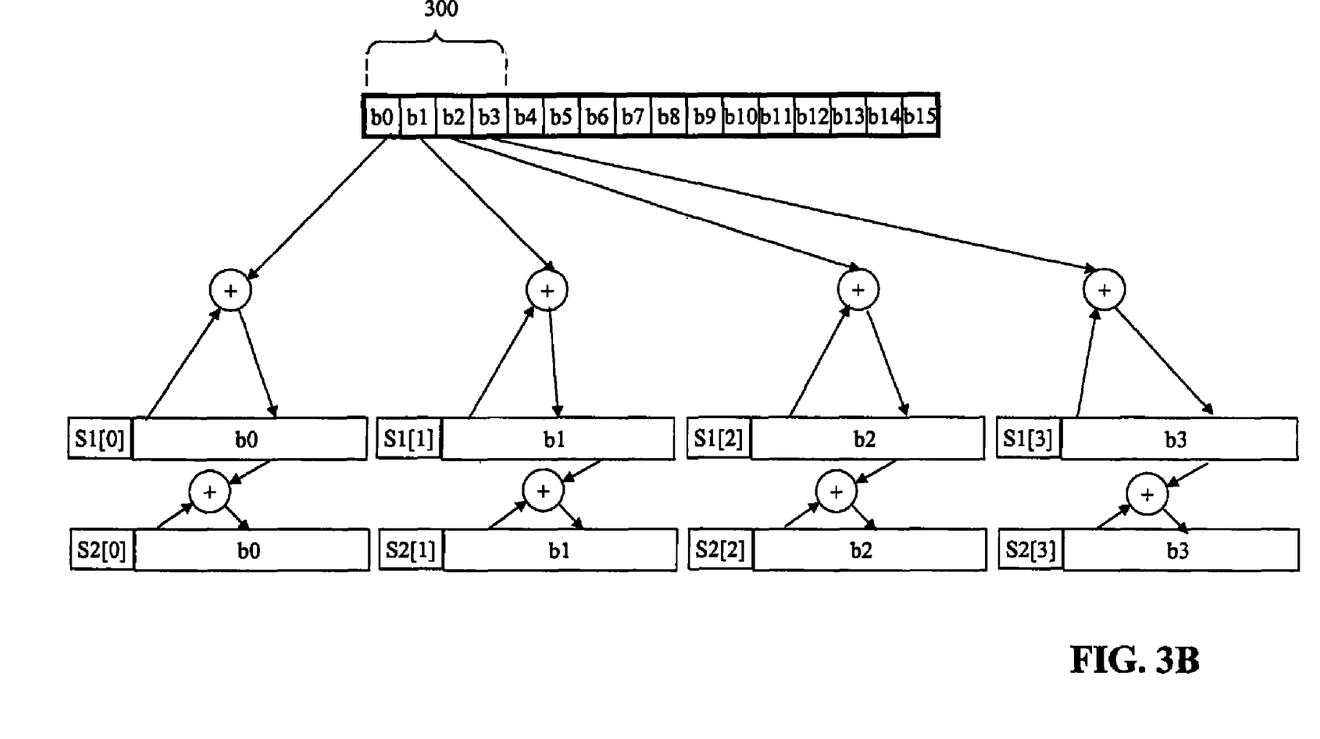
Figure 3C:
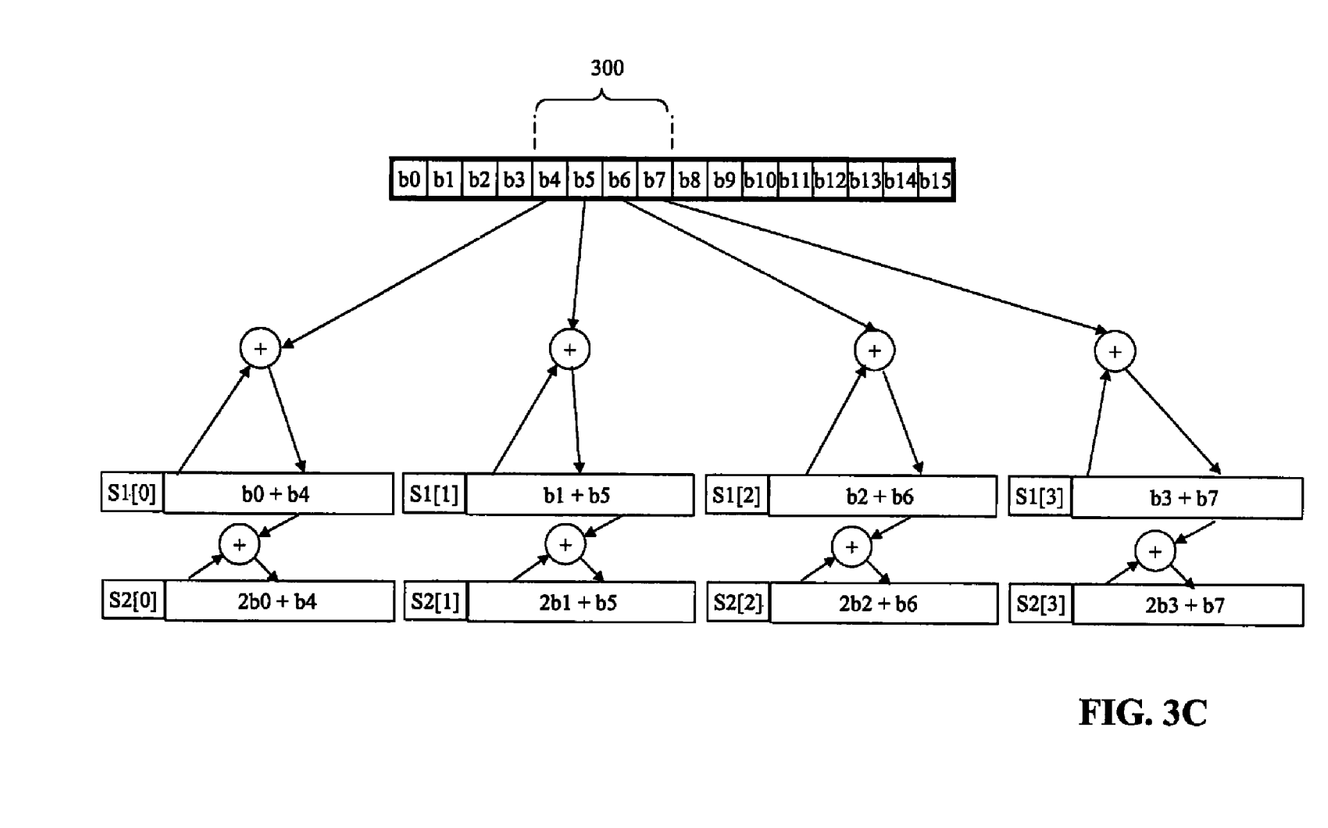

FIG. 3B illustrates accumulated values in the sub-partial checksum accumulators upon completion of operations 204 and 205 for data units b0 to b3. Upon transferring to data check operation 202 for the second time, there is still data to process and so load data operation 203 moves register 300 so that data units b4 to b7 are loaded in register 300 as illustrated in FIG. 3C. FIG. 3C also illustrates the accumulated values in of the sub-partial checksum accumulators upon completion of operations 204 and 205 for data units b4 to b7.

Figure 3D:
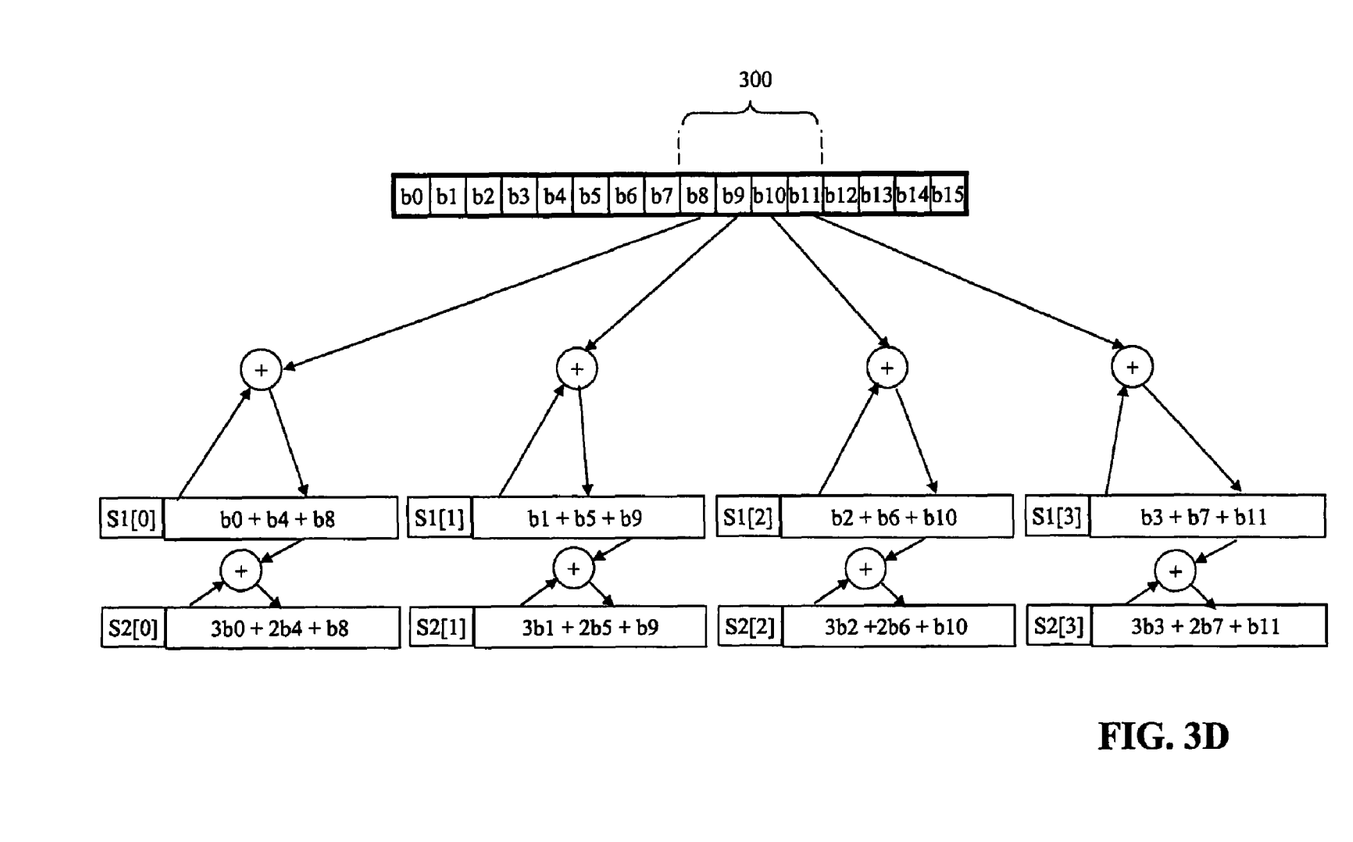

Upon transferring to data check operation 202 for the third time, there is still data to process and so load data operation 203 moves register 300 so that data units b8 to b11 are loaded in register 300 as illustrated in FIG. 3D. FIG. 3D also illustrates the accumulated values in the sub-partial checksum accumulators upon completion of operations 204 and 205 for data units b8 to b11.

Figure 3E:
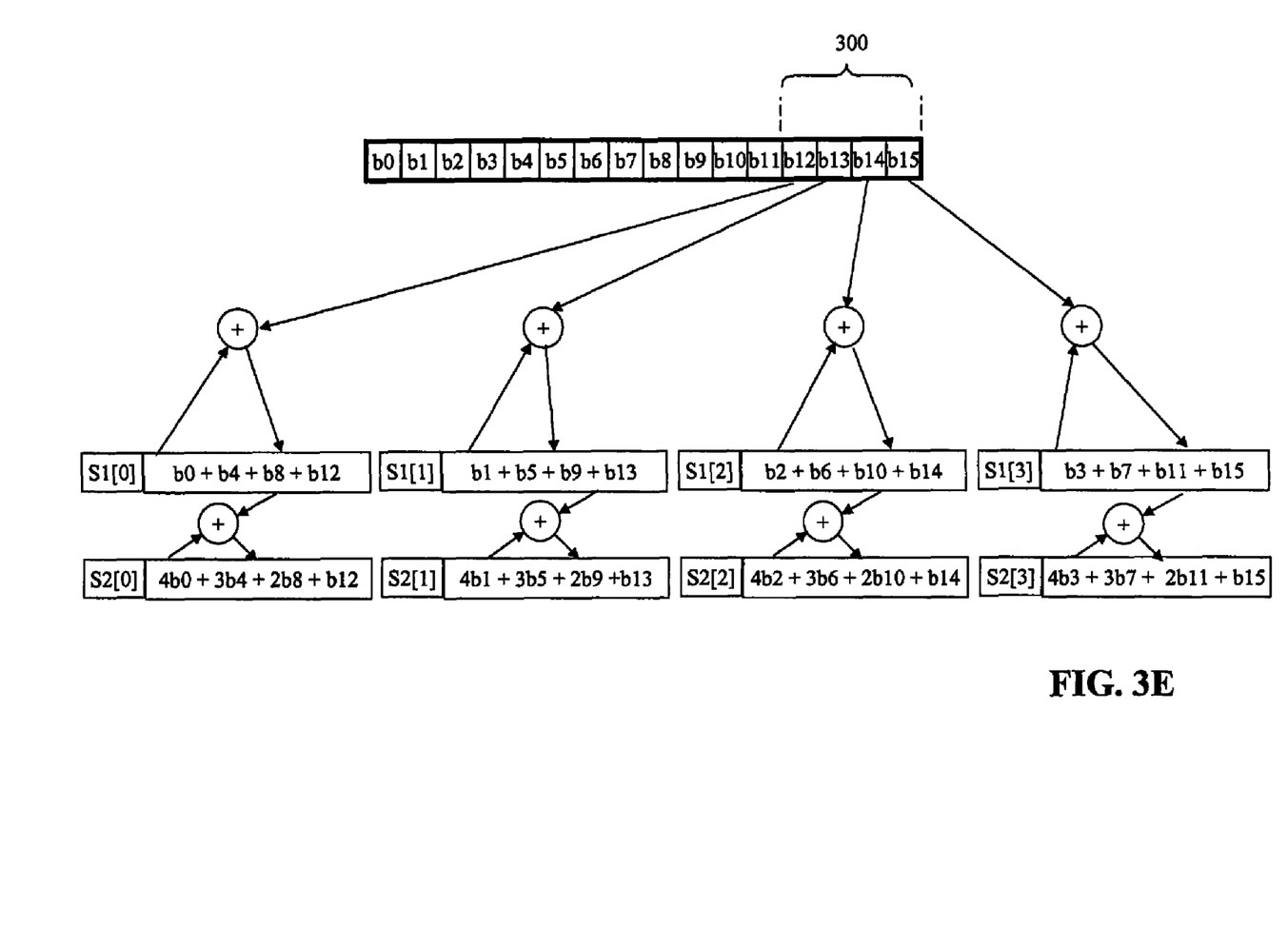

Upon transferring to data check operation 202 for the fourth time, there is still data to process and so load data operation 203 moves register 300 so that data units b12 to b15 are loaded in register 300 as illustrated in FIG. 3E. FIG. 3E also illustrates the accumulated values in the sub-partial checksum accumulators upon completion of operations 204 and 205 for data units b12 to b15.

Upon transferring to data check operation 202 for the fifth time, there is no more data to process and so data check operation 202 transfers to correct and accumulate second partial checksum operation 206. As indicated above, operation 206 corrects SIMD second partial checksum S2_SIMD, which, from FIG. 3E, is:

$$S2\_SIMD = S2[0] + S2[1] + S2[2] + S2[3]$$
$$= 4b0 + 4b1 + 4b2 + 4b3 + 3b4 + 3b5 + 3b6 + 3b7 +$$
$$2b8 + 2b9 + 2b10 + 2b11 + b12 + b13 + b14 + b15$$

Figure 3F:
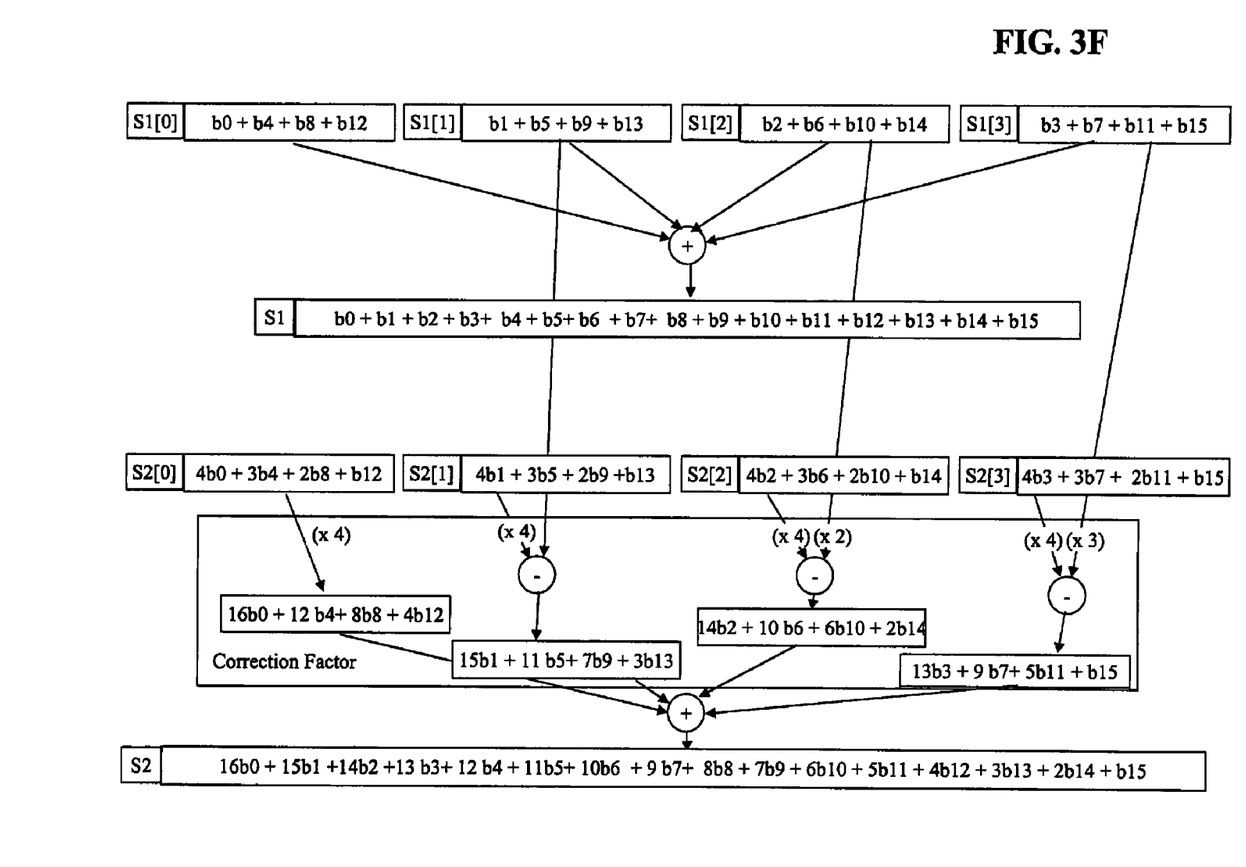

The correction factor is illustrated in FIG. 3F. SIMD second partial checksum S2_SIMD is multiplied by the degree of SIMD processing, four, and that value is corrected by subtracting the sum of (i) the first sub-partial checksum accumulated value in first sub-partial checksum accumulator S1[1], (ii) two times the first sub-partial checksum accumulated value in first sub-partial checksum accumulator S1[2], and (iii) three times the first sub-partial checksum accumulated value in first sub-partial checksum accumulator S1[3]. The way that the correction factor is illustrated in FIG. 3F is for ease of understanding only and is not intended to limit the invention to the specific form of the processes indicated therein.

In one embodiment, operation 206 performs the following process to obtain second partial checksum S2:
S2=((S2[0]+S2[1]+S2[2]+S2[3])<<2)−S1[1]−(S1[2]<<1)−(S1[3]<<3)−S1[3]
where << represents a shift operation. Thus, second partial checksum S2 is obtained using low-cost shift operations, rather than requiring multiplications, which in turn further reduces the processing cost of applying the correction factor. Upon completion of correct and accumulate second partial checksum operation 206 processing transfers to accumulate first partial checksum operation 207.

Accumulate first partial checksum operation 207 sums the accumulated first sub-partial checksums to obtain first partial checksum S1. Operation 207 transfers to final checksum operation 208.

Final checksum operation 208 concatenates the two partial checksums S1 and S2 to obtain the Fletcher/Alder checksum and stores the final checksum in a computer readable medium.

In process 200 as described above, overflow considerations were not a factor. However, in some embodiments, overflow can be a factor. When overflow is a factor the integer registers are still virtually partitioned into a number of sub-fields and process 200 is modified to ensure that the values in the sub-fields do not interact. This is ensured in hardware for SIMD instructions, but needs to be managed by execution of software in this embodiment.

For instance, if a 64-bit register is virtually portioned into four 16-bit sub-fields and 8-bit values are accumulated, the number of accumulations that can be performed before the accumulated 8-bit values reach 16-bits in size and then overflow into the adjacent virtual 16-bit field must be determined.

Given the nature of the operations performed, the size of the variables and the size of the SIMD sub-field in an integer register, the number of operations that can be performed before an overflow into an adjacent sub-field in that integer register can occur can be calculated exactly. In one embodiment, the number of accumulate operations that can be performed is calculated and then a number of operations less than the calculated number is selected as a maximum number of iterations to be done before corrective action is taken to prevent overflow.

Figure 4:
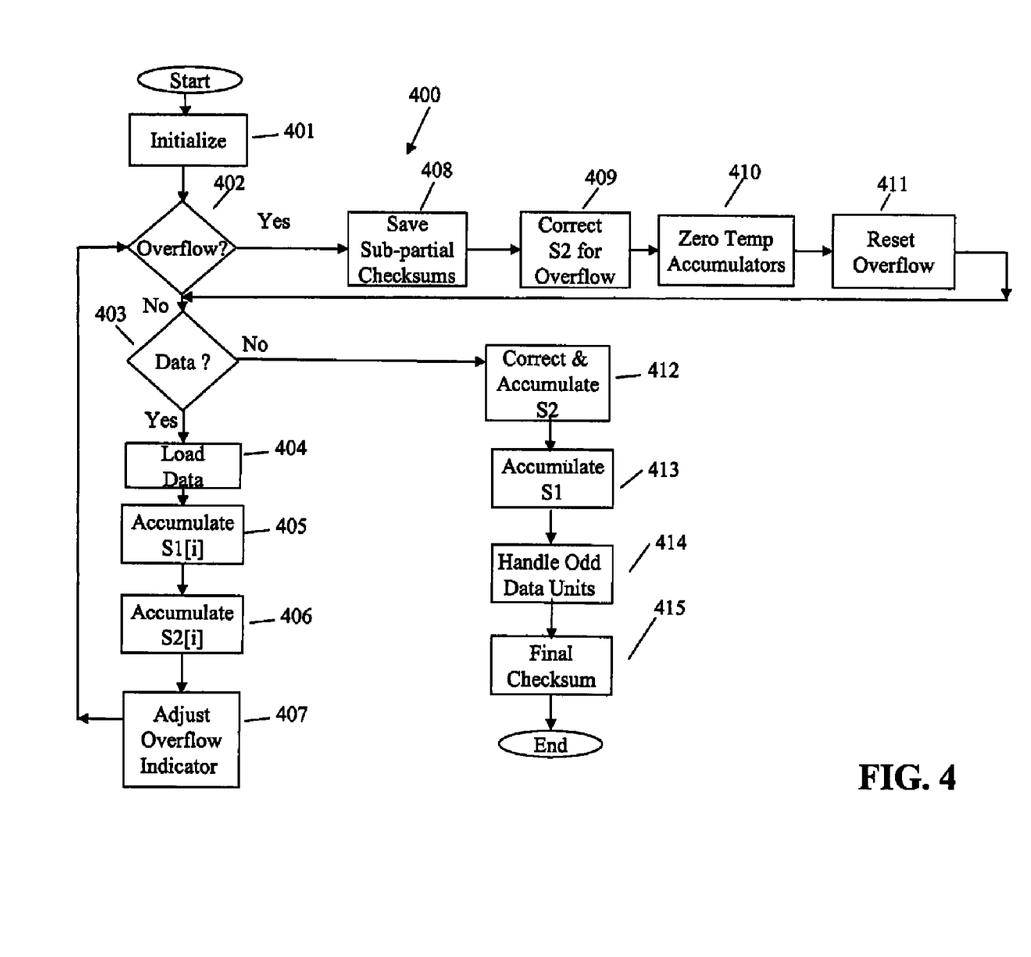
FIG. 4 is a process flow diagram for another process according to one embodiment of this invention.

Process 400 is one embodiment of the single SIMD pipeline computer-based transformation process that includes overflow considerations. In initialize operation 401, the virtual partitions are defined. A plurality of first sub-partial checksum accumulators S1[0], S1[1], . . . , S1[N−1], a plurality of temporary first sub-partial checksum accumulators, a plurality of temporary second sub-partial checksum accumulators, and SIMD second partial checksum S2_SIMD are defined and initialized to zero.

An overflow counter is initialized, in this embodiment, to a maximum number of iterations to be done before corrective action is taken to prevent overflow. For example, if eight iterations can be done before corrective action to prevent overflow is required, the overflow counter is initialized to eight in one embodiment.

Upon completion of initialize operation 401, processing transfers to overflow check operation 402. Overflow check operation 402 determines whether the overflow counter has an overflow value that indicates that an overflow correction is needed. In the embodiment, where the overflow count is initialized to eight, the overflow value is zero. If the overflow counter does not have the overflow value, processing transfers to data check operation 403 and otherwise to save sub-partial checksums operation 408.

Data check operation 403 determines whether all sets of N-data units in the data string, for which the Fletcher/Alder checksum is being generated, have been processed. Since this is the initial operation, data is available and data check operation 403 transfers processing to load data operation 404. If all the sets of N-units of data in the data string had been processed, processing transfers to correct and accumulate second partial checksum operation 412.

Load data operation 404 loads a plurality of data units b1, b2, b(N−1) into the virtual input register 300 for the SIMD pipeline. Upon completion, load data operation 404 transfers processing to accumulate first sub-partial checksums operation 405.

In accumulate first sub-partial checksums operation 405, each data unit bi is added to a value stored in the corresponding temporary first sub-partial checksum accumulator T_S1[i] and the result is stored back in temporary first sub-partial checksum accumulator T_S1[i]. Upon completion, accumulate first sub-partial checksums operation 405 transfers to accumulate second sub-partial checksums operation 406.

In accumulate second sub-partial checksums operation 406, each accumulated value stored in a temporary second sub-partial checksum accumulator T_S2[i] is added to the accumulated value stored in the corresponding temporary first sub-partial checksum accumulator T_S1[i] and the accumulated value is stored back in temporary second sub-partial checksum accumulator T_S2[i]. Upon completion, accumulate second sub-partial checksums operation 406 transfers to adjust overflow indicator operation 407.

Adjust overflow indicator operation 407 adjusts the value of the overflow counter to indicate that another iteration has been completed. In one embodiment, the overflow counter is decremented. Upon completion operation 407 transfers to overflow check operation 403.

Operations 403 to 407 are repeated, as described above, until the overflow counter has the overflow value. When the overflow counter has the overflow value, operation 403 transfers to save sub-partial checksums operation 408.

Save sub-partial checksums operation 408 saves the accumulated values in the temporary sub-partial checksum accumulators. First, the value in each first sub-partial checksum accumulator S1[i] is saved for use in operation 409. The accumulated value in each temporary first sub-partial checksum accumulator T_S1[i] is added to the value in the corresponding first sub-partial checksum accumulator S1[i] and the accumulated value is stored back in first sub-partial checksum accumulator S1[i]. The accumulated value in each temporary second sub-partial checksum accumulator T_S2[i] is added to SIMD second partial checksum SIMD_S2 and SIMD second partial checksum SIMD_S2 is saved. Operation 408 transfers to correct second partial checksum for overflow operation 409.

Once overflow occurs, and the temporary accumulation totals are added to the master accumulations in operation 408, correct second partial checksum for operation 409 corrects SIMD second partial checksum SIMD_S2 to take into account the effect that accumulation totals for first partial checksum S1 would have normally had on SIMD second partial checksum SIMD_S2 during the last accumulation period.

Once a element has been introduced into first sub-partial checksum accumulator S1[i] that element continues to effect the value of first sub-partial checksum accumulator S1[i] until all of the elements have been processed (due to the feedback from S1 into S2). However, because each temporary first sub-partial checksum accumulator T_S1[i] only takes into account the effects of the range of elements processed since the last overflow, it is necessary to correct for the effect of the previously accumulated elements contained in each first sub-partial checksum accumulator S1[i]. Thus, operations 409 performs to following correction to SIMD second partial checksum SIMD_S2:

$$SIMD\_S2 += \left(\left(\sum_i (S1[i])\right) \ll X\right)$$

where X is the number of iterations undertaken before an overflow occurred. Here, each first sub-partial checksum accumulator S1[i] is the one that was saved in process 408, before the saved value of that first sub-partial checksum accumulator S1[i] was accumulated with the latest value of temporary first sub-partial checksum accumulator T_S1[i].

Notice that the correction in operation 409 is performed after every overflow and does not take the place of the final correction operation which must still be performed as before. Also, note that the master accumulation totals (each S1[i] and SIMD_S2) use the full register width and overflow is no longer a problem. Hence, SIMD accumulation is used for a short time, then the SIMD totals are accumulated into the master totals before continuing with SIMD processing for the next set of elements. Upon completion, operation 409 transfers processing to zero temporary accumulators operation 410.

Zero temporary accumulators operation 410 initializes plurality of temporary first sub-partial checksum accumulators T_S1[0], T_S1[1], . . . , T_S1[N−1] and plurality of second sub-partial checksum accumulators T_S2[0], T_S2[1], . . . , T_S2[N−1] to zero. Operation 410 transfers to reset overflow operation 411.

Reset overflow operation 411 resets the overflow counter to the maximum number of iterations to be done before corrective action is taken to prevent overflow. Operation 411 transfers processing to save data check operation 403.

Assuming that data is still available to be processed, operations 402 to 407 are performed again for each iteration until overflow check operation transfers to operation 408. Operations 408 to 411 are performed and the iterations in operations 402 to 407 repeated, unless data check operation 403 transfers to correct and accumulate second partial checksum operation 412.

Correct and accumulate second partial checksum operation 412 is similar to operation 206 described above. Correct and accumulate second checksum operation 308 corrects SIMD second partial checksum S2_SIMD to obtain second partial checksum S2. Specifically, $$S2 = (N * SIMD\_S2) - \left(\sum_i (i * S1[i])\right)$$

Upon completion of correct and accumulate second partial checksum operation 412 processing transfers to accumulate first partial checksum operation 413. Accumulate first partial checksum operation 413 sums the accumulated first sub-partial checksums to obtain first partial checksum S1. Operation 413 transfers to handle odd data units operation 414.

When processing transfers to handle odd data units 414, all the sets of N-data units in the data string have been processed, but there may remain an odd number of data units. Operation 414 includes these data units in the current values of first and second partial checksums S1 and S2 and transfers to final checksum operation 415. One example of this processing is presented below in Table 1.

Final checksum operation 415 concatenates the two partial checksums S1 and S2 to obtain the Fletcher/Alder checksum and stores the final checksum in a computer readable medium. As is known to those of skill in the art, the final checksum is determined differently depending upon whether a Fletcher checksum or an Alder checksum is generated, and so "Fletcher/Alder checksum" means that one of the two checksums is generated.

Performing integer multiplication operations is costly in terms of performance on most processors so leveraging the standard prior art SIMD approach for generating Fletcher/Alder checksums does not provide a performance benefit when emulating SIMD using standard integer multiplications. However, as described above, the processes of this invention eliminate the need for such costly operations in the generation of the sub-partial checksums and significant performance benefits, over a 1.8 times improvement, have been observed.

Table 1 below is one embodiment of a computer program that when compiled and executed implements process 400. The computer program is written in the C programming language. The use of the C-programming language is illustrative only and is not intended to limit the invention to this specific embodiment.

TABLE 1

```
#include <sun_prefetch.h>
int new_chk(int init, unsigned char *buf, int len)
{
    /*
     * Need to decompose base checksum value into S1 and S2
     * components
     */
    int S1 = init & 0xffff;
    int S2 = (init >> 16) & 0xffff;
    /*
```

TABLE 1-continued

```
           * Various sub-totals
           */
          unsigned long long ta, tb, u1 = 0, u2 = 0,
                         x1 = 0, x2 = 0;
          unsigned long long *b64, tmp[2];
          unsigned long long S1_0 = 0, S1_1 = 0, S1_2 = 0,
                         S1_3 = 0, S1_4 = 0, S1_5 = 0,
                         S1_6 = 0, S1_7 = 0;
          unsigned long long S2_0 = 0, offset,
                         tc = 0x00ff00ff00ff00ff;
          unsigned short *tmp16;
          int c;
          /* Zero sub-totals*/
          u1 = 0; u2 = 0; x1 = 0; x2 = 0;
                    S1_0 = 0; S1_1 = 0; S1_2 = 0; S1_3 = 0;
          S1_4 = 0;
          S1_5 = 0; S1_6 = 0; S1_7 = 0;
          S2_0 = 0; offset = S1;
          /*
           * Inner loops handle 128-bytes -- need to do
           * final clean-up if
           * # of bytes to be processed is not a multiple
           *of 128
           */
          while (len >= 128) {
                    /*
                     * Can perform only 8 iterations before the
                     * sub-totals could potentially overflow
                     */
                    for (c = 0; c < 8; c++)
                    {
                              b64 = (unsigned long long *) buf;
/*Load 8-bytes of data ||a0|a1|a2|a3|a4|a5|a6|a7||
*/
                              tb = b64[0];
/*Extract even elements||00|a0|00|a2|00|a4|00|a6||
*/
                              ta = tb >> 8;
                              ta = ta & tc;
                              /*Update even sub-totals*/
                              u1 += ta;
                              u2 += u1;
/*Extract odd elements||00|a1|00|a3|00|a5|00|a7||
*/
                              tb = tb & tc;
                              /*Update odd sub-totals*/
                              x1 += tb;
                              x2 += x1;
/*Load another 8-bytes of data
*         ||a0|a1|a2|a3|a4|a5|a6|a7||
*/
                              /*Loop has been unrolled*/
                              tb = b64[1];
/*Extract even elements||00|a0|00|a2|00|a4|00|a6||
*/
                              ta = tb >> 8;
                              ta = ta & tc;
                              /*Update even sub-totals*/
                              u1 += ta;
                              u2 += u1;
/*Extract odd elements||00|a1|00|a3|00|a5|00|a7||
*/
                              tb = tb & tc;
                              /*Update odd sub-totals*/
                              x1 += tb;
                              x2 += x1;
                              /* Update data pointer*/
                              buf += 16;
                    }
          /* Launch prefetchs for subsequent data elements*/
                    sparc_prefetch_read_many(buf+64);
                    sparc_prefetch_read_many(buf+128);
                    /* Update counter*/
                    len -= 128;
          /*
           * Extract each of the 4 subtotals from u2 and x2
           * and add to S2 total
           */
                    S2_0 += (u2>>48);
                    S2_0 += (x2>>48);
                    S2_0 += (((u2<<16)>>48));
                    S2_0 += (((x2<<16)>>48));
                    S2_0 += (((u2<<32)>>48));
                    S2_0 += (((x2<<32)>>48));
                    S2_0 += (((u2<<48)>>48));
                    S2_0 += (((x2<<48)>>48));
          /*
           * Need to include effect of previous S1 sub-
           * totals on S2
           */
                    ta = S1_0 + S1_1 + S1_2 + S1_3 + S1_4 + S1_5 +
                              s1_6 + S1_7;
          /*
           Also need to include impact of initial S1 value
           */
                    S2_0 += (ta<<4) + (offset<<4);
          /*
           * Extract 4 sub-totals from u1 and x1
           * and add to S1 sub-totals
           */
                    tmp[0] = u1;
                    tmp[1] = x1;
                    tmp16 = (unsigned short *) &tmp[0];
                    S1_3 += ((tmp16[0]));
                    S1_7 += ((tmp16[4]));
                    S1_2 += (tmp16[1]);
                    S1_6 += (tmp16[5]);
                    S1_1 += (tmp16[2]);
                    S1_5 += (tmp16[6]);
                    S1_0 += tmp16[3];
                    S1_4 += (tmp16[7]);
                    /* Zero temporary totals*/
                    u1 = 0;
                    u2 = 0;
                    x1 = 0;
                    x2 = 0;
          }
          /*
           * Generate final result from sub totals
           */
          /* Combine S1 sub-totals*/
          ta = S1_0 + S1_1 + S1_2 + S1_3 + S1_4 + S1_5 +
                    S1_6 + S1_7;
          /* Apply corrections to S2 sub-total*/
          tb = (s2_0 << 3);
          tb = tb - S1_7 - (s1_2<<1) - 3*s1_6 - (s1_1<<2)
                         - 5*s1_5 - 6*s1_0 - 7*s1_4;
          /* Update S1 and S2 values*/
          S1 += ta;
          S2 += tb;
          /*
           * Handle any remaining bytes that need
           *processing
           */
          if (k != 0) do {
                    S1 += *buf++;
                    S2 += S1;
          } while (--k);
          S1 &= 0xffff;
          S2 &= 0xffff;
          return (s2 << 16) | S1;
}
```

Figure 5:
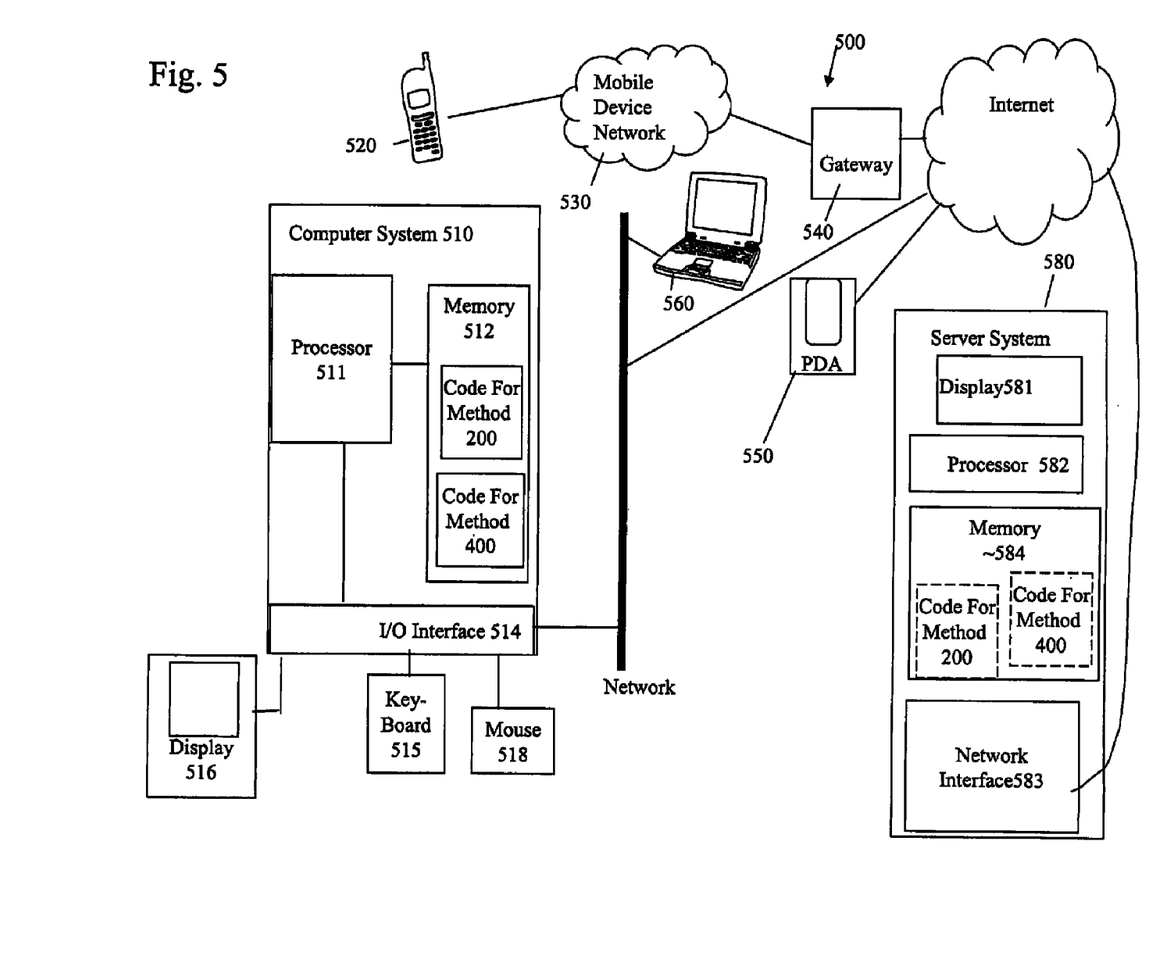
FIG. 5 is a block diagram of units and systems in which, in one embodiment, the processes of this invention can be implemented, stored and used.

In one embodiment, computer program instructions for any one of or any combination of methods 200, 400 are stored in memory 512 that is included in a hardware configuration 510 like a personal computer or workstation. Memory 512 is coupled to processor 511. In this embodiment, applications and operating system(s) are included in memory 512 or a memory coupled to processor 511 via the Internet for example. Hardware configuration 510 includes, but is not limited to, an I/O interface 514, a display 516, a keyboard 514, and a mouse 518.

However, in another embodiment, system 510 is part of a client-server computer system 500. In this embodiment, server system 580 includes a processor 582 as well as a display 581, memory 584 including optionally all or part of computer program instructions for any one of or any combination of methods 200, 400, and a network interface 583. Thus, system 580 can perform methods 200 and 400.

For either a client-server computer system 500 or a standalone computer system 510, memory 512 typically includes both volatile memory, such as main memory, and non-volatile memory, such as hard disk drives. While memory 512 is illustrated as a unified structure in FIG. 5, this should not be interpreted as requiring that all memory in memory 512 is at the same physical location. All or part of memory 512 can be in a different physical location than processor 511.

Processor 511 should be coupled to the memory containing all or part of computer program instructions for any one of or any combination of methods 200, 400. This could be accomplished in a client-server system, or alternatively via a connection to another computer via modems and analog lines, or digital interfaces and a digital carrier line. For example, all of part of memory 512 could be in a World Wide Web portal, while processor 511 is in a personal computer, for example.

More specifically, all or part of computer program instructions for any one of or any combination of methods 200, 400 can be included in a portable computer 560, a workstation 510, a server computer 580, or any other device such as mobile telephone 520, gateway 540, or personal digital assistant 550. Similarly, in another embodiment, system 500 can be comprised of multiple different computers, wireless devices, server computers, or any desired combination of these devices that are interconnected to perform the operations, as described herein.

Herein, a computer program product comprises a computer readable medium configured to store or transport computer readable code for one or both of methods 200, 400 or in which computer readable code for one or both of methods 200, 400 is stored. Some examples of computer program products are CD-ROM discs, DVD discs, flash memory, ROM cards, floppy discs, magnetic tapes, computer hard drives, servers on a network and signals transmitted over a network representing computer readable program code. A tangible computer program product comprises a computer readable medium configured to store computer readable code for one or both of methods 200, 400 or in which computer readable code for one or both of methods 200, 400 is stored. Some examples of tangible computer program products are CD-ROM discs, DVD discs, flash memory, ROM cards, floppy discs, magnetic tapes, computer hard drives, and servers on a network.

Herein, a computer memory refers to a volatile memory, a non-volatile memory, or a combination of the two. Similarly, a computer input unit, e.g., keyboard 515 and mouse 518, and a display unit 516 refer to the features providing the required functionality to input the information described herein, and to display the information described herein, respectively, in any one of the aforementioned or equivalent devices.

In view of this disclosure, one or both of methods 200, 400 can be implemented in a wide variety of computer system configurations using an operating system and computer programming language of interest to the user. In addition, instructions for the method could be stored as different modules in memories of different devices. For example, instructions for the method could initially be stored in a server computer 580, and then as necessary, a module of the method could be transferred to a client device and executed on the client device.

In yet another embodiment, instructions for the method are stored in a memory of another computer system. Stored instructions for the method are transferred over a network 504 to memory 512 in system 500.

The method is implemented, in one embodiment, using a computer source program. The computer program may be stored on any common data carrier like, for example, a floppy disk or a compact disc (CD), as well as on any common computer system's storage facilities like hard disks. Therefore, one embodiment of the present invention also relates to a data carrier for storing a computer source program for carrying out the inventive method. Another embodiment of the present invention also relates to a method for using a computer system for carrying out the method. Still another embodiment of the present invention relates to a computer system with a storage medium on which a computer program for carrying out the method is stored.

While methods 200, 400 hereinbefore have been explained in connection with one embodiment thereof, those skilled in the art will readily recognize that modifications can be made to this embodiment without departing from the spirit and scope of the present invention.

I claim:

1. A computer-based method comprising:
using a single SIMD pipeline in a processor to perform a process for generating a Fletcher/Alder checksum for a data string, said process comprising:
accumulating a plurality of first sub-partial checksums $S1[0], S1[1], \ldots, S1[N-1]$,
where N is an integer;
N is a degree of SIMD processing; and
said plurality of first sub-partial checksums $S1[0], S1[1], \ldots, S1[N-1]$ are stored in integer registers of said processor;
accumulating a plurality of second sub-partial checksums $S2[0], S2[1], \ldots, S2[N-1]$ wherein said plurality of second sub-partial checksums $S2[0], S2[1], \ldots, S2[N-1]$ are stored in integer registers of said processor;
accumulating said plurality of second sub-partial checksums $S2[0], S2[1], \ldots, S2[N-1]$ to generate a SIMD second partial checksum;
scaling said SIMD second partial checksum, using a shift operation, by N to obtain a scaled SIMD second partial checksum;
correcting said scaled SIMD second partial checksum to generate a second partial checksum S2;
accumulating said plurality of first sub-partial checksums $S1[0], S1[1], \ldots, S1[N-1]$ to generate a first partial checksum S1;
combining said first and second partial checksums S1, S2 to generate a Fletcher/Alder checksum for said data string; and
storing said Fletcher/Alder checksum in a memory wherein said Fletcher/Alder checksum is for use in determining integrity of said data string.

2. The process of claim 1 further comprising:
loading N-data units of said data string into an input register.

3. The process of claim 2 wherein said accumulating said plurality of second sub-partial checksums $S2[0], S2[1], \ldots, S2[N-1]$ includes accumulating said plurality of second sub-partial checksums $S2[0], S2[1], \ldots, S2[N-1]$ for said N-data units in said input register.

4. The process of claim 3 wherein said accumulating a plurality of first sub-partial checksums $S1[0], S1[1], \ldots, S1[N-1]$ includes accumulating said plurality of first sub-partial checksums $S1[0], S1[1], \ldots, S1[N-1]$ for said N-data units in said input register.

5. The process of claim 4 further comprising:
repeating said loading and accumulatings for said N-data units for each set of N-data units in said data string.

6. The process of claim 1 further comprising:
detecting an overflow condition;
performing said repeating after said detecting said overflow condition.

7. The process of claim 1 further comprising:
virtually partitioning at least one integer register to include at least two of said first sub-partial checksums in said plurality of first sub-partial checksums S1[0], S1[1], . . . , S1[N−1].

8. The process of claim 1 further comprising:
virtually partitioning at least one integer register to store at least two of said second sub-partial checksums in said plurality of second sub-partial checksums S1[0], S1[1], . . . , S1[N−1].

9. A computer-based method comprising:
using a single SIMD pipeline in a processor to perform a process for generating a Fletcher/Alder checksum for a data string, said process comprising:
virtually partitioning integer registers for storage of a plurality of first sub-partial checksums S1[0], S1[1], . . . , S1[N−1],
where N is an integer; and
N is a degree of SIMD processing;
virtually partitioning integer registers for storage of a plurality of second sub-partial checksums S2[0], S2[1], . . . , S2[N−1];
loading N-data units of a data string into an input register;
accumulating, in parallel, said plurality of first sub-partial checksums S1[0], S1[1], . . . , S1[N−1] for said N-data units;
accumulating, in parallel, said plurality of second sub-partial checksums S2[0], S2[1], . . . , S2[N−1] for said N-data units;
repeating said load operation and said accumulating operations for each set of N-data units in said data string;
accumulating said plurality of second sub-partial checksums to generate a SIMD second partial checksum;
scaling said SIMD second partial checksum, using a shift operation, by N to obtain a scaled SIMD second partial checksum;
correcting said scaled SIMD second partial checksum to generate a second partial checksum S2;
accumulating said plurality of first sub-partial checksums to generate a first partial checksum S1;
combining said first and second partial checksums S1, S2 to generate a checksum for said data string; and
storing said checksum in a memory.

10. The process of claim 9 further comprising:
detecting an overflow condition;
performing said repeating after said detecting said overflow condition.

11. A computer program product comprising a non-transitory computer readable storage media having embodied therein instructions for a method comprising:
using a single SIMD pipeline in a processor to perform a process for generating a Fletcher/Alder checksum for a data string, said process comprising:
accumulating a plurality of first sub-partial checksums S1[0], S1[1], . . . , S1[N−1],
where N is an integer;
N is a degree of SIMD processing; and
said plurality of first sub-partial checksums S1[0], S1[1], . . . , S1[N−1] are
stored in integer registers of said processor;
accumulating a plurality of second sub-partial checksums S2[0], S2[1], . . . , S2[N−1] wherein said plurality of second sub-partial checksums S2[0], S2[1], . . . , S2[N−1] are stored in integer registers of said processor;
accumulating said plurality of second sub-partial checksums S2[0], S2[1], . . . , S2[N−1] to generate a SIMD second partial checksum;
scaling said SIMD second partial checksum, using a shift operation, by N to obtain a scaled SIMD second partial checksum;
correcting said scaled SIMD second partial checksum to generate a second partial checksum S2;
accumulating said plurality of first sub-partial checksums S1[0], S1[1], . . . , S1[N−1] to generate a first partial checksum S1;
combining said first and second partial checksums S1, S2 to generate a Fletcher/Alder checksum for said data string; and
storing said Fletcher/Alder checksum in a memory wherein said Fletcher/Alder checksum is for use in determining integrity of said data string.

* * * * *